(12) United States Patent
Lee et al.

(10) Patent No.: US 10,658,398 B2
(45) Date of Patent: May 19, 2020

(54) DISPLAY DEVICE AND MANUFACTURING METHOD THEREOF

(71) Applicant: SAMSUNG DISPLAY CO., LTD., Yongin-si, Gyeonggi-do (KR)

(72) Inventors: Jong Chan Lee, Yongin-si (KR); Woong Hee Jeong, Yongin-si (KR); Tae Hoon Yang, Yongin-si (KR); Yong Su Lee, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 16/036,985

(22) Filed: Jul. 17, 2018

(65) Prior Publication Data

US 2019/0096925 A1    Mar. 28, 2019

(30) Foreign Application Priority Data

Sep. 22, 2017  (KR) .......................... 10-2017-0122743

(51) Int. Cl.
  *H01L 27/12*    (2006.01)
(52) U.S. Cl.
  CPC ........ *H01L 27/1248* (2013.01); *H01L 27/124* (2013.01); *H01L 27/1222* (2013.01); *H01L 27/1274* (2013.01)

(58) Field of Classification Search
  CPC ........................ H01L 27/1248; H01L 27/1251
  See application file for complete search history.

(56) References Cited

U.S. PATENT DOCUMENTS 9,443,875 B2 * 9/2016 Li ........................ H01L 27/1225
10,276,601 B2 * 4/2019 Kanda ............... H01L 29/78633

FOREIGN PATENT DOCUMENTS

| KR | 10-2016-0043327 A | 4/2016 |
| KR | 10-2016-0150199 A | 12/2016 |
| KR | 10-2017-0044797 A | 4/2017 |

* cited by examiner

*Primary Examiner* — Yu-Hsi D Sun
(74) *Attorney, Agent, or Firm* — Kile Park Reed & Houtteman PLLC

(57) ABSTRACT

A display device includes a substrate, a buffer layer on the substrate, a first semiconductor layer of a first transistor on the buffer layer, a first insulating layer disposed on the first semiconductor layer, a first gate electrode of the first transistor on the first insulating layer, a second insulating layer on the first gate electrode, and a second semiconductor layer of a second transistor disposed on the second insulating layer. A difference between a first distance between a lower side of the buffer layer and an upper side of the second insulating layer and a second distance between an upper side of the first semiconductor layer and an upper side of the second insulating layer is 420 to 520 angstroms.

10 Claims, 9 Drawing Sheets

DISPLAY DEVICE AND MANUFACTURING METHOD THEREOF

CROSS-REFERENCE TO RELATED APPLICATION

Korean Patent Application No. 10-2017-0122743, filed on Sep. 22, 2017, in the Korean Intellectual Property Office, and entitled: "Display Device and Manufacturing Method Thereof," is incorporated by reference herein in its entirety.

BACKGROUND

1. Field

This disclosure relates to a display device and a manufacturing method thereof.

2. Description of the Related Art

Transistors included in various electronic devices such as display devices include a gate electrode, a source electrode, a drain electrode, and a semiconductor layer. The transistors are used as switches or driving elements in the display device. Transistor display panels including the transistors are used as circuit boards for driving pixels in the display devices. The transistor display panel may include a gate line for transmitting a gate signal, a data line for transmitting a data voltage corresponding to an image signal, and a pixel electrode connected to the transistor.

There are increasing demands for high-resolution display devices. When spacing between transistors is reduced, transistor density may be increased to increase resolution, while the area occupied by the transistors may be reduced to increase an aperture ratio of pixels. When transistors are not formed on a same layer, but are stacked on different layers, spacing between transistors may be reduced. This stacked structure may, however, require an additional processing stage.

SUMMARY

An exemplary embodiment provides a display device including: a substrate; a buffer layer disposed on the substrate; a first semiconductor layer of a first transistor disposed on the buffer layer; a first insulating layer disposed on the first semiconductor layer; a first gate electrode of the first transistor disposed on the first insulating layer; a second insulating layer disposed on the first gate electrode; and a second semiconductor layer of a second transistor disposed on the second insulating layer. A difference between a first distance between a lower side of the buffer layer and an upper side of the second insulating layer and a second distance between an upper side of the first semiconductor layer and an upper side of the second insulating layer is 420 to 520 angstroms.

A difference between a third distance between an upper side of the first gate electrode and an upper side of the second insulating layer and the second distance may be 420 to 520 angstroms.

The first distance may correspond to a sum of thicknesses of the buffer layer, the first insulating layer, and the second insulating layer in a region not overlapping the first semiconductor layer.

The second distance may correspond to a sum of thicknesses of the first insulating layer and the second insulating layer in a region overlapping the first semiconductor layer and not overlapping the first gate electrode.

The third distance may correspond to a thickness of the second insulating layer in a region overlapping the first gate electrode.

The second transistor may include a second gate electrode overlapping the second semiconductor layer, and a thickness of the second semiconductor layer may be equal to or less than 500 angstroms.

The first semiconductor layer and the second semiconductor layer may respectively include polysilicon.

The first semiconductor layer may include a first channel overlapping the first gate electrode, and a first source electrode and a first drain electrode positioned at respective sides of the first channel. The second semiconductor layer may include a second channel overlapping the second gate electrode, and a second source electrode and a second drain electrode positioned at respective sides of the second channel.

The display device may further include a third insulating layer disposed between the second semiconductor layer and the second gate electrode, and a fourth insulating layer disposed on the second gate electrode. The first transistor may include a first source connector and a first drain connector connected to the first source electrode and the second drain electrode through contact holes passing through the first insulating layer, the second insulating layer, the third insulating layer, and the fourth insulating layer.

The display device may further include: a pixel electrode disposed on the second transistor; a light emitting member disposed on the pixel electrode; and a common electrode disposed on the light emitting member.

Another embodiment provides a method for manufacturing a display device, including: forming a buffer layer on a substrate; forming a first semiconductor layer of a first transistor on the buffer layer; forming a first insulating layer on the first semiconductor layer; forming a first gate electrode of the first transistor on the first insulating layer; forming a second insulating layer on the first gate electrode; and forming a second semiconductor layer of a second transistor on the second insulating layer. The forming of a second semiconductor layer includes forming an amorphous silicon layer and crystallizing amorphous silicon in the amorphous silicon layer, and the first semiconductor layer is activated or annealed when the crystallization is performed.

A difference between a first distance between a lower side of the buffer layer and an upper side of the second insulating layer and a second distance between an upper side of the first semiconductor layer and an upper side of the second insulating layer is 420 to 520 angstroms.

A difference between a third distance between an upper side of the first gate electrode and an upper side of the second insulating layer and the second distance may be 420 to 520 angstroms.

The first semiconductor layer and the second semiconductor layer may respectively include polysilicon.

The first distance may correspond to a sum of thicknesses of the buffer layer, the first insulating layer, and the second insulating layer in a region not overlapping the first semiconductor layer.

The second distance may correspond to a sum of thicknesses of the first insulating layer and the second insulating layer in a region overlapping the first semiconductor layer and not overlapping the first gate electrode.

The third distance may correspond to a thickness of the second insulating layer in a region overlapping the first gate electrode.

A thickness of the second semiconductor layer may be equal to or less than 500 angstroms.

The method may further include: forming a third insulating layer on the second semiconductor layer; forming a second gate electrode of the second transistor on the third insulating layer; forming a fourth insulating layer on the second gate electrode; and forming a first source connector and a first drain connector connected to the first semiconductor layer through the first insulating layer, the second insulating layer, the third insulating layer, and the fourth insulating layer, and forming a second source connector and a second drain connector connected to the second semiconductor layer through the third insulating layer and the fourth insulating layer.

Another embodiment provides a display device, including a substrate, a buffer layer on the substrate, a first semiconductor layer of a first transistor on the buffer layer, a first insulating layer on the first semiconductor layer, a first gate electrode of the first transistor on the first insulating layer, a second insulating layer on the first gate electrode, and a second semiconductor layer of a second transistor on the second insulating layer. The buffer layer, the first insulating layer, and the second insulating layer may include a same material having a duty cycle between maximum transmittances with respect to a thickness of the same material. A difference in thickness between a first sum of a thickness of the buffer layer, the first insulating layer, and the second insulating layer, and a second sum of a thickness of the first insulating layer and the second insulating layer may be about half a duty cycle or an odd integer multiple thereof.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
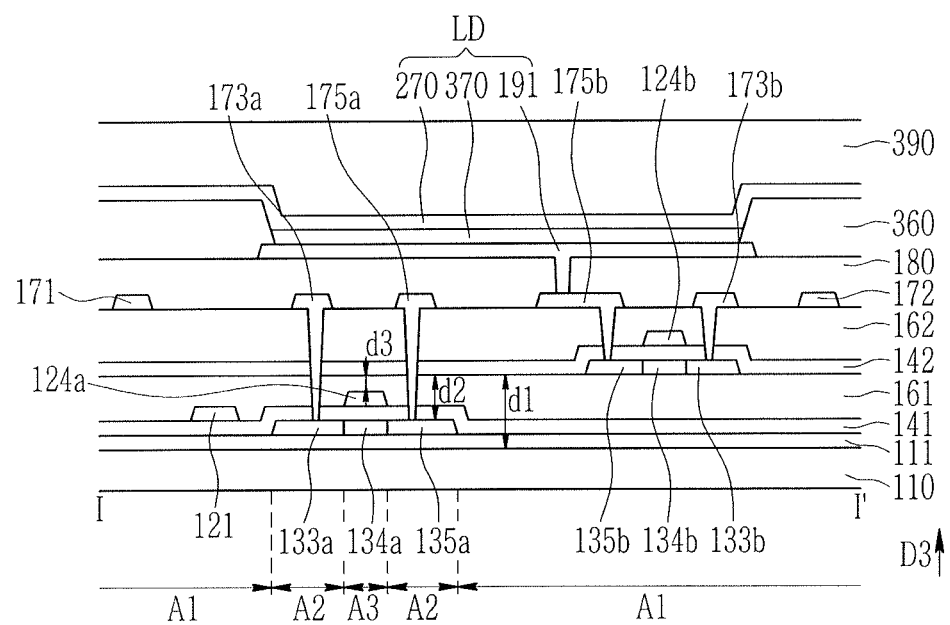
FIG. 1 illustrates a cross-sectional view of a display device according to an exemplary embodiment.

In the following detailed description, only certain exemplary have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive, and like reference numerals designate like elements throughout the specification.

The size and thickness of each configuration shown in the drawings are arbitrarily shown for better understanding and ease of description, and the embodiments are not limited thereto. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

A display device according to embodiments will now be described in detail with reference to accompanying drawings.

Figure 2:
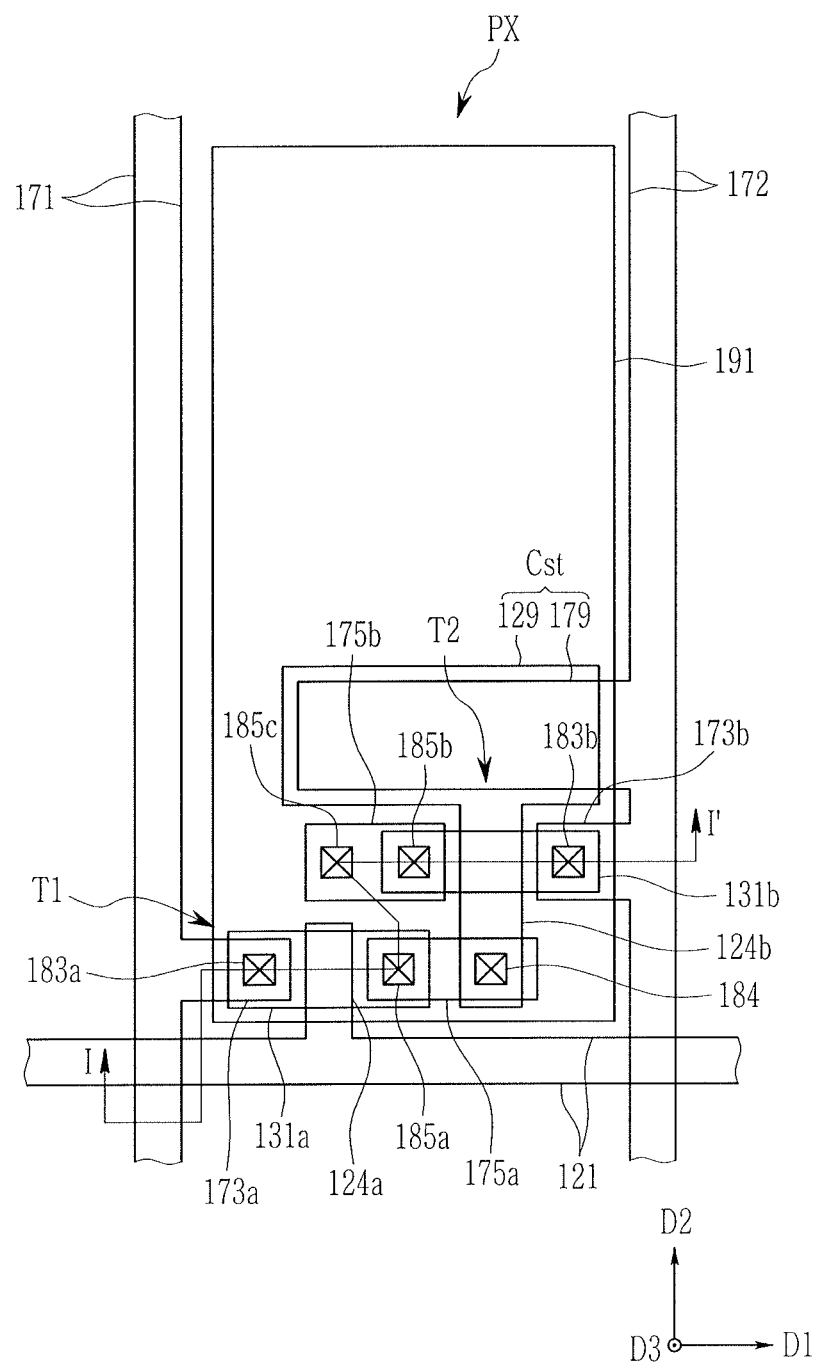
FIG. 2 illustrates a top plan view of a display device shown in FIG. 1.
Figure 3:
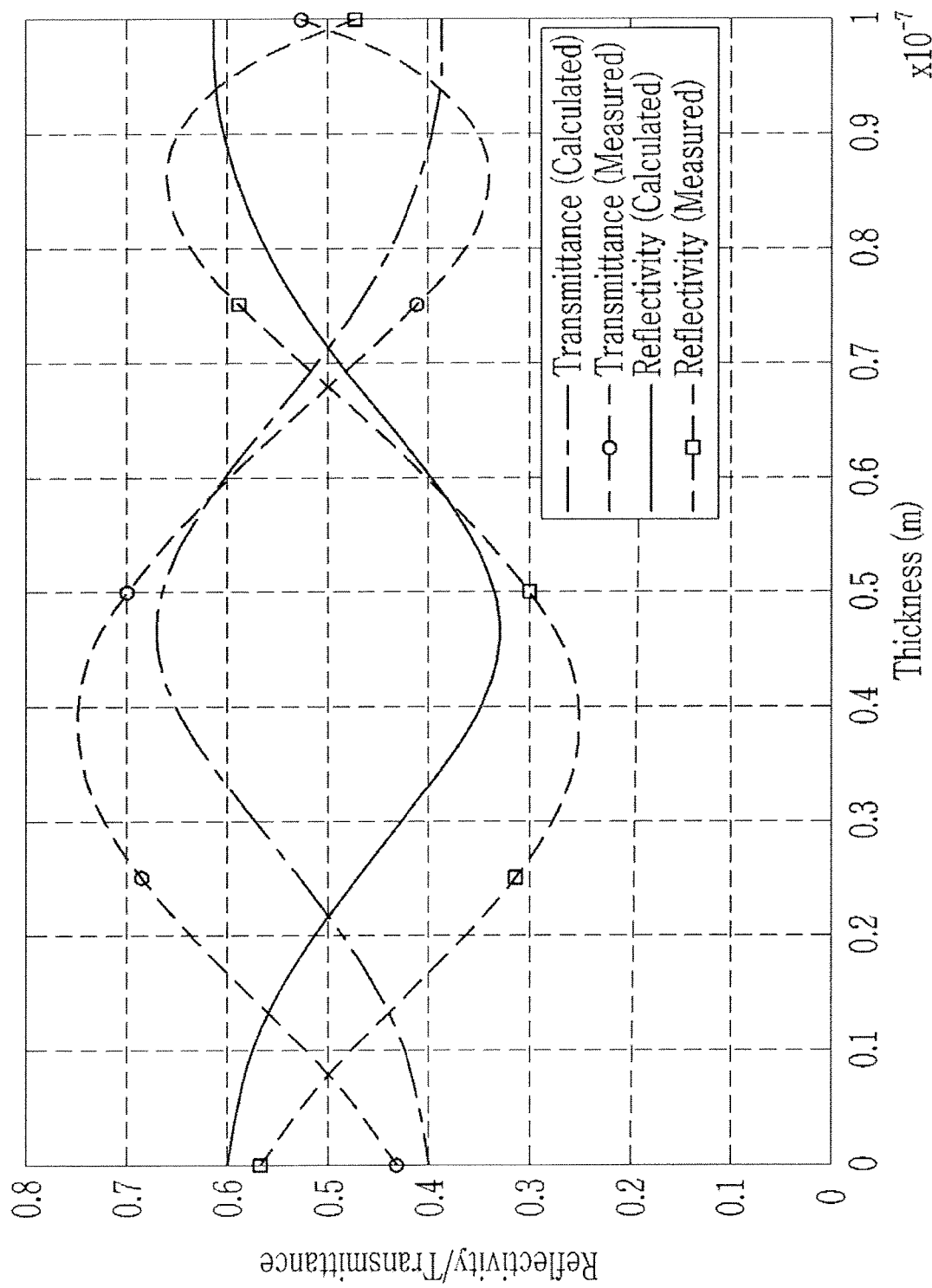
FIG. 3 illustrates a graph of optical characteristics according to a thickness of an insulating layer.
Figure 4:
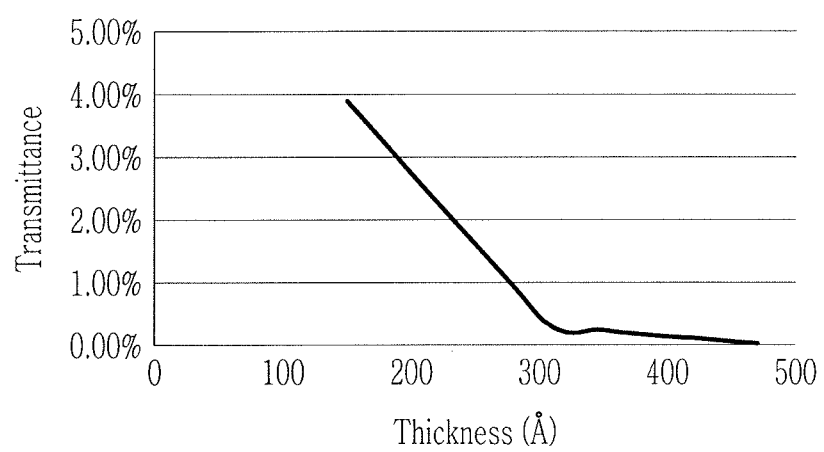
FIG. 4 illustrates a graph of transmittance according to a thickness of a semiconductor layer.

FIG. 1 illustrates a cross-sectional view of a display device according to an exemplary embodiment. FIG. 2 illustrates a top plan view of a display device shown in FIG. 1. FIG. 3 illustrates a graph of optical characteristics according to a thickness of an insulating layer. FIG. 4 illustrates a graph of transmittance according to a thickness of a semiconductor layer.

FIG. 1 shows a cross-sectional view of a display device shown in FIG. 2 with respect to a line I-I', and a plan view of a display device having a cross-sectional structure as shown in FIG. 1 is not limited to that shown in FIG. 2. FIG. 2 shows a region corresponding to one pixel of an organic light emitting device including a first transistor T1 and a second transistor T2, but embodiments are not limited to the organic light emitting device, and may be applied to other types of display devices, e.g., a liquid crystal display.

Referring to FIG. 1 and FIG. 2, the display device includes a substrate 110, and a first transistor T1, a second transistor T2, and an organic light emitting diode LD disposed on the substrate 110.

In the drawings, a first direction D1 and a second direction D2 are parallel to a side that is seen in a direction that is perpendicular to a surface of the substrate 110, e.g., a surface on which constituent elements are stacked, and are perpendicular to each other. A third direction D3 is perpendicular to the first direction D1 and the second direction D2 and it is substantially perpendicular to the surface of the substrate 110. The third direction D3 may be mainly indicated in a cross-sectional structure, and is also referred to as a cross-sectional direction, a stacking direction, or a thickness direction. A structure that is seen when a side in parallel to the first direction D1 and the second direction D2 is observed is referred to as a plane structure. When a first constituent element is on a second constituent element in the cross-sectional structure, it means that the two constituent elements are arranged on one another in the third direction D3, and a third constituent element may be between the constituent elements.

The substrate 110 may be a flexible substrate, e.g., a plastic substrate. For example, the substrate 110 may be made of polymers such as polyimide, polyamide, polycarbonate, or polyethylene terephthalate. Alternatively, the substrate 110 may be a rigid substrate, e.g., a glass substrate.

A buffer layer 111 may be on the substrate 110. The buffer layer 111 may block an impurity that may diffuse into a first semiconductor layer 131a from the substrate 110 and may reduce a stress applied to the substrate 110 during a process for forming the first semiconductor layer 131a of the first transistor T1. The buffer layer 111 may increase adhesiveness of the first semiconductor layer 131a to the substrate 110. The buffer layer 111 is an insulating layer, but is called a buffer layer in consideration of its function.

A first transistor T1 is on the buffer layer 111. The first transistor T1 includes the first semiconductor layer 131a and a first gate electrode 124a disposed thereon along the third direction D3. The first semiconductor layer 131a includes a first channel 134a overlapping the first gate electrode 124a, e.g., along the third direction D3, and a first source electrode 133a and a first drain electrode 135a at respective sides of the first channel 134a. The first semiconductor layer 131a may include polysilicon formed by crystallizing amorphous silicon by a crystallization method, e.g., excimer laser annealing (ELA). Further, the first source electrode 133a and the first drain electrode 135a are ion-doped and activated on the first semiconductor layer 131a. A first insulating layer 141 is between the first semiconductor layer 131a and the first gate electrode 124a.

A second transistor T2 is on the first transistor T1 along the third direction D3. The second transistor T2 includes a second semiconductor layer 131b and a second gate electrode 124b. The second semiconductor layer 131b includes a second channel 134b overlapping the second gate electrode 124b, and a second source electrode 133b and a second drain electrode 135b at respective sides of the second channel 134b. The second semiconductor layer 131b includes polysilicon formed by crystallizing amorphous silicon by a crystallization method, e.g., ELA. Further, the second source electrode 133b and the second drain electrode 135b are ion-doped and activated on the second semiconductor layer 131b. A third insulating layer 142 is between the second semiconductor layer 131b and the second gate electrode 124b.

Regarding one pixel PX of the organic light emitting device, the first transistor T1 may be a switching transistor, and the second transistor T2 may be a driving transistor. The pixel PX includes two transistors T1 and T2 in the shown exemplary embodiment. However, the pixel PX may include at least three transistors.

The first transistor T1 and the second transistor T2 are disposed along the third direction D3 with a second insulating layer 161 therebetween. In further detail, the first transistor T1 is between the substrate 110 and the second insulating layer 161, and the second transistor T2 is between the second insulating layer 161 and a fourth insulating layer 162. Therefore, the first transistor T1 and the second transistor T2 form a stacked structure along the third direction D3. The second transistor T2 is over the first transistor T1 in the shown exemplary embodiment. Alternatively, the first transistor T1 may be disposed over the second transistor T2.

According to the above-noted stacked structure, the gap or spacing between the first transistor T1 and the second transistor T2 may be reduced or the first transistor T1 and the second transistor T2 may be at least partially overlap each other along the third direction D3, so the freedom of designing transistors increases. Therefore, such a stacked structure may increase the aperture ratio of the pixel and/or increase of the resolution of the display device. However, since the first semiconductor layer 131a and the second semiconductor layer 131b are formed on different layers and respectively need crystallization and activation, an additional processing stage may be needed.

The buffer layer 111, the first insulating layer 141, the second insulating layer 161, the third insulating layer 142, and the fourth insulating layer 162 may respectively include an inorganic insulating material, e.g., a silicon oxide ($SiO_x$) or a silicon nitride ($SiN_x$). In the present specification, the buffer layer 111 represents an insulating layer between the substrate 110 and the first semiconductor layer 131a. The first insulating layer 141 represents an insulating layer between the first semiconductor layer 131a and the first gate electrode 124a. The second insulating layer 161 represents an insulating layer between the first gate electrode 124a and the second semiconductor layer 131b. The third insulating layer 142 represents an insulating layer between the second semiconductor layer 131b and the second gate electrode 124b. The fourth insulating layer 162 represents an insulating layer between the second gate electrode 124b and the gate line 171. Each of the insulating layers may be formed as a single layer or multiple layers. For example, the buffer layer 111 may be formed as dual layers, and a lower layer closer to the substrate 110 may include a silicon nitride and an upper layer may include a silicon oxide.

According to an exemplary embodiment, additional processing stages may be minimized and/or characteristics of the first semiconductor layer 131a may be improved by controlling thicknesses of the buffer layer 111, the first insulating layer 141, and the second insulating layer 161. For example, a first distance d1 that is a sum of thicknesses of the buffer layer 111, the first insulating layer 141, and the second insulating layer 161 in the first region A1 not overlapping the first semiconductor layer 131a may be greater than a second distance d2 that is a sum of thicknesses of the first insulating layer 141 and the second insulating layer 161 in the second region A2 overlapping the first semiconductor layer 131a and not the first gate electrode 124a by about 420 to 520 angstroms, about 440 to 500 angstroms, or about 460 to 480 angstroms. A third distance d3 that is a thickness of the first insulating layer 141 in the third region A3 overlapping the first gate electrode 124a may be less than the second distance d2 by about 420 to 520 angstroms, about 440 to 500 angstroms, or about 460 to 480 angstroms. As shown, the first distance d1 corresponds to a distance between a lower side of the buffer layer 111 and an upper side of the second insulating layer 161 (or a distance between an upper side of the substrate 110 and an upper side of the second insulating layer 161), the second distance d2 corresponds to a distance between an upper side of the first semiconductor layer 131a and an upper side of the second insulating layer 161, and the third distance d3 corresponds to a distance between an upper side of the first gate electrode 124a and an upper side of the second insulating layer 161.

When the thicknesses of the buffer layer 111, the first insulating layer 141, and the second insulating layer 161 are controlled as described above, damage that may generated to the substrate 110 and the first gate electrode 124a may be prevented while activating or annealing the first semiconductor layer 131a by using energy applied for crystallization for forming the second semiconductor layer 131b. In other words, heat applied to the first source electrode 133a and the first drain electrode 135a of the first semiconductor layer 131a when the second semiconductor layer 131b is crystallized may be maximized and heat applied to the substrate 110 and the first gate electrode 124a may be minimized by setting a difference of thicknesses of the insulating layers disposed between the substrate 110 and the second semiconductor layer 131b in the first region A1, the second region A2, and the third region A3. A detailed description of different transfer of heat caused by the difference of thicknesses of the insulating layers will be provided in a latter portion of the present specification with reference to FIG. 3.

Conventionally, the first semiconductor layer 131a may be activated by heating the substrate 110 on which the first transistor T1 is formed, e.g., in a furnace. In this instance, an activation temperature influences the substrate 110, so the substrate 110 may be damaged, particularly when the substrate 110 is a plastic substrate. Thus, the activation temperature of the first semiconductor layer 131a should not be set too high. However, when the activation temperature is lowered to prevent the substrate 110 from being damaged, reliability (e.g., deterioration of electron/hole mobility, deterioration of lifespans, and increase of leakage current) of the first transistor T1 may be reduced.

According to the exemplary embodiment, high heat may be selectively applied to the first semiconductor layer 131a that needs to be activated, so the reliability of the first transistor T1 may be improved without damaging the substrate 110 or the first gate electrode 124a. Further, the first semiconductor layer 131a may be activated when the second semiconductor layer 131b is crystallized, so no additional processing stage for activating the first semiconductor layer 131a is needed.

Referring to FIG. 3, a graph for indicating optical characteristics according to a thickness of an insulating layer, particularly calculated values and measured values of transmittance and reflectivity according to a thickness of silicon oxide as the insulating layer, is provided. Following equations are used to find the calculated values of transmittance and reflectivity.

$$R = \frac{n_f^2(1-n_s)^2\cos^2\Phi + (n_s - n_f^2)^2\sin^2\Phi}{n_f^2(1-n_s)^2\cos^2\Phi + (n_s - n_f^2)^2\sin^2\Phi}$$

$$\Phi = \frac{n_f d}{\lambda_0} 2\pi$$

$$T = (1-R)^2$$

Here, R is reflectivity, $n_f$ is a refractive index of a film, $n_s$ is a refractive index of a substrate, $\Phi$ is a phase difference, d is a thickness of a film, $\lambda_0$ is a wavelength of incident light, and T is transmittance.

Herein, incident light is assumed to have a wavelength of 308 nm; the substrate is assumed to be polysilicon with a refractive index of 3.49 and an extinction coefficient of 4.29; and the film is assumed to be silicon dioxide ($SiO_2$) with a refractive index of 1.48 and an extinction coefficient of $0.2 \times 10^{-4}$ to output the reflectivity and the transmittance according to the thickness of the silicon dioxide insulating layer as illustrates in the graph of FIG. 3.

As can be seen from the graph of FIG. 3, the transmittance and reflectivity of the insulating layer periodically increases and decreases as the thickness of the insulating layer increases. Within each period, a same thickness may provide a minimum value for the reflectivity and has a maximum value for the transmittance, e.g., the transmittance and reflectivity are substantially out of phase. The calculated values and the measured values show the same periodical characteristics of the transmittance and reflectivity. However, the calculated values, as well as differences between thickness providing the minimum and maximum values, are slightly different from the measured values. This is because the actual insulating layer being measured may include various kinds of silicon oxides ($SiO_x$) in addition to the silicon dioxide, while the calculated values assume the insulating layer is pure silicon dioxide ($SiO_2$). Therefore, based upon the measured values, within the range of thicknesses shown in FIG. 3, the insulating layer has maximum transmittance at a thickness of about 390 angstroms, has minimum transmittance at a thickness of about 860 angstroms, and a difference of thicknesses between these is about 470 angstroms. The above-described difference between the first distance d1 and the second distance d2 and the above-described difference between the second distance d2 and the third distance d3 are set considering the measured values and errors.

The thickness differences between the maximum and minimum values for the reflectivity and transmittance are almost the same when the thickness of the insulating layer increases, due to the periodicity approximating a sine wave according to the thickness of the insulating layer. Therefore, the maximum or minimum value of transmittance is repeated at a thickness change of about every 470*2 angstroms, e.g., these curves have a duty cycle of about 470*2 angstroms.

Based on the above-noted transmittance characteristic in accordance with the thickness of the insulating layer, the first distance d1 and the third distance d3 may be set at a thickness corresponding to a minimum value of transmittance, and the second distance d2 may be set at a thickness corresponding to a maximum value of transmittance. The maximum amount of heat applied when the second semiconductor layer 131b is crystallized may be transmitted to portions (i.e., the first source electrode 133a and the first drain electrode 135a) of the first semiconductor layer 131a provided in the second region A2, and the minimum amount of heat thereof may be transmitted to the substrate 110 and the first gate electrode 124a provided in the first region A1 and the third region A3.

When the maximum value, the minimum value, and the periodicity of the transmittance due to the thickness of the insulating layer, for example, the intended effect may be maximized when the third distance d3 is about (890+470*2l) angstroms, the second distance d2 is about (1360+470*2m) angstroms, and the first distance d1 is about (1830+470*2p) angstroms (here, l, m, and p are nonnegative integers and may be the same as or different from each other). Therefore, the first distance d1, the second distance d2, and the third distance d3 may be set with an optimal value or to be within a predetermined range (e.g., ±5%, ±10%, ±20%, etc.) of the optimal value. In particular, the first and third distances may be set to be a starting value, e.g., a smallest thickness that provides a maximum transmittance value, plus even multiples (or zero for the distance d3) of the thickness difference between maximum and minimum transmittances, while the second distance may be set to be the starting value plus an odd integer multiple of the thickness different between maximum and minimum transmittances. Thus, a difference between the first distance and the second distance may be about half a duty cycle or an odd integer multiple thereof.

However, the exemplary embodiment is not limited thereto the above-noted setting. For example, the first distance d1, the second distance d2, and the third distance d3 may be changed by a certain degree according to contributions from the first buffer layer 111, the first insulating layer 141, and the second insulating layer 161 or in consideration of other design variables. For example, the third distance d3, the second distance d2, and the first distance d1 may be about 1000 angstroms, about 1500 angstroms, and about 2000 angstroms, respectively, and the respective distances may increase by about 1000 angstroms.

The second semiconductor layer 131b may be formed to have a predetermined range of thickness. When the second semiconductor layer 131b is very thick, transmittance (more accurately, transmittance of an amorphous silicon layer to a polysilicon layer) of the second semiconductor layer 131b is deteriorated, so heat applied when the second semiconductor layer 131b is crystallized may not sufficiently reach the first semiconductor layer 131a. In relation to this, FIG. 4 shows a graph of transmittance of an amorphous semiconductor layer according to thickness. Referring to FIG. 4, when the thickness thereof is greater than about 500 angstroms, its transmittance is almost 0%, so it may be difficult for the heat applied to the semiconductor layer to be transmitted to a layer provided below the semiconductor layer. Therefore, the thickness of the second semiconductor layer 131b may be equal to or less than, for example, about 500 angstroms. However, when the second semiconductor layer 131b is very thin, the characteristics of the second transistor T2 may be deteriorated, and the constituent elements provided below the same may be damaged because of high transmittance. Therefore, the thickness of the second semiconductor layer 131b may be greater than, for example, about 150 angstroms, about 300 angstroms, or about 350 angstroms. The thickness of the second semiconductor layer 131b may be appropriately changed according to the energy applied at the time of crystallization, and heat transmitted to the first semiconductor layer 131a may be controlled by controlling the thickness of the second semiconductor layer 131b.

Referring to FIG. 1 and FIG. 2, the gate electrodes 124a and 124b of the first transistor T1 and the second transistor T2 are on the semiconductor layers 131a and 131b, so they may be referred to as top gate type of transistors. However, the transistors may have various configurations, and for example, at least one of the first transistor T1 and the second transistor T2 may be a bottom gate type of transistor in which the gate electrodes 124a and 124b are disposed below the semiconductor layers 131a and 131h.

The first transistor T1 and the second transistor T2 may be nMOS transistors or pMOS transistors, and one of them may be an nMOS transistor and the other may be a pMOS transistor. On the first semiconductor layer 131a, the first source electrode 133a and the first drain electrode 135a of the first transistor T1 may be set by a direction of carriers that flow through the first channel 134a when a gate-on voltage is applied to the first gate electrode 124a, and the carriers flow to the first drain electrode 135a from the first source electrode 133a. Therefore, when the first transistor T1 is operated, electrons flow to the first drain electrode 135a from the first source electrode 133a in the n-type transistor, and holes flow to the first drain electrode 135a from the first source electrode 133a in the p-type transistor. A relationship between the second source electrode 133b and the second drain electrode 135b of the second transistor T2 corresponds to that of the first transistor T1.

A first source connector 173a, a first drain connector 175a, a second source connector 173b, and a second drain connector 175b are disposed on a fourth insulating layer 162 for covering a second transistor T2. The first source connector 173a and the first drain connector 175a are connected to the first source electrode 133a and the first drain electrode 135a of the first transistor T1 through contact holes 183a and 185a passing through the first insulating layer 141, the second insulating layer 161, the third insulating layer 142, and the fourth insulating layer 162. The second source connector 173b and the second drain connector 175b are connected to the second source electrode 133b and the second drain electrode 135b of the second transistor T2 through contact holes 183b and 185b passing through the third insulating layer 142 and the fourth insulating layer 162. Alternatively, at least one of the first source connector 173a and the first drain connector 175a may be below the fourth insulating layer 162. For example, at least one of the first source connector 173a and the first drain connector 175a may be on the same layer as the second gate electrode 124b and may be formed of the same material as the second gate electrode 124b.

A data line 171 for transmitting a data signal and a driving voltage line 172 for transmitting a driving voltage are disposed on the fourth insulating layer 162. The data line 171 and the driving voltage line 172 may exemplarily extend in the second direction D2. A gate line 121 for transmitting a gate signal may be disposed between the first insulating layer 141 and the second insulating layer 161 in a like manner of the first gate electrode 124a. The gate line 121 may cross the data line 171 and may extend in the first direction D1.

A pixel electrode 191 is on a planarized layer 180. The pixel electrode 191 is connected to the second drain connector 175b through a contact hole 185c passing through the planarized layer 180. The second drain connector 175b is connected to the second drain electrode 135b of the second transistor T2, so the pixel electrode 191 is electrically connected to the second drain electrode 135b of the second transistor T2. In the shown exemplary embodiment, the lower first transistor T1 is a switching transistor, and the upper second transistor T2 is a driving transistor. Alternatively, when the first transistor T1 is a driving transistor, the pixel electrode 191 may be connected to the first drain connector 175a connected to the first drain electrode 135a of the first transistor T1.

Regarding the display device, a portion to the pixel electrode 191 from the substrate 110 is also referred to as a transistor display substrate, a transistor array substrate, and a transistor substrate. The transistor display substrate may be applied to other types of display devices such as a liquid crystal display as well as the organic light emitting device.

A pixel defining layer 360 is on the planarized layer 180 and the pixel electrode 191. The pixel defining layer 360 includes an opening overlapping the pixel electrode 191. A light emitting member 370 including an emission layer is in the opening of the pixel defining layer 360, and a common electrode 270 is on the light emitting member 370. The pixel electrode 191, the light emitting member 370, and the common electrode 270 form an organic light emitting diode LD, which is a light-emitting device. The pixel electrode 191 may be an anode of the organic light emitting diode LD, and the common electrode 270 may be a cathode of the organic light emitting diode LD.

An encapsulation layer 390 for protecting the organic light emitting diode LD may be disposed on the common electrode 270. The encapsulation layer 390 may exemplarily be a thin-film encapsulation layer in which at least one inorganic insulating layer and at least one organic insulating layer are alternately stacked.

A storage capacitor Cst of the display device may, e.g., be formed by a first storage electrode 129 extending from the second gate electrode 124b, a second storage electrode 179 extending from the driving voltage line 172, and an insulating layer (e.g., a fourth insulating layer 162) between the first storage electrode 129 and the second storage electrode 179. The constituent elements of the storage capacitor Cst, and positions thereof, may be modifiable in various ways.

A method for manufacturing a display device shown with reference to FIG. 1 and FIG. 2 according to an exemplary embodiment will now be described with reference to FIG. 5 to FIG. 9.

Figure 5:
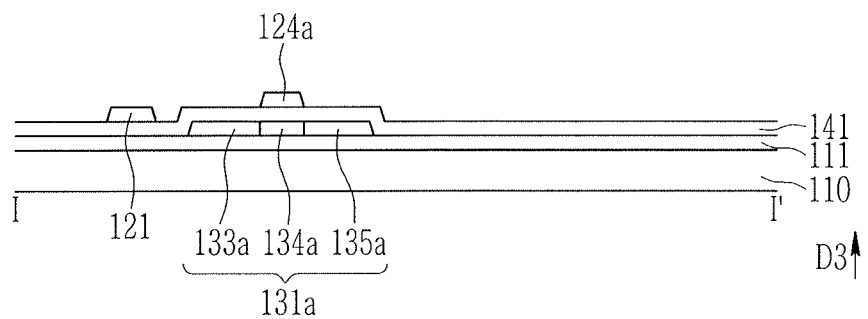
FIG. 5 to FIG. 9 illustrate cross-sectional views of stages in a method for manufacturing a display device according to an exemplary embodiment.

Referring to FIG. 5, an inorganic insulating material such as a silicon oxide or a silicon nitride is deposited on the substrate 110 that may be a plastic substrate by use of a chemical vapor deposition (CVD) method to thus form a buffer layer 111. A first transistor T1 is formed on the buffer layer 111.

In further detail of formation of the first transistor T1, a semiconductor material such as amorphous silicon is deposited on the buffer layer 111 through CVD to form an amorphous silicon layer, and the amorphous silicon layer is crystallized to form a polysilicon layer. Suitable crystallization methods, without being limited thereto, includes, e.g., ELA, metal induced crystallization (MIC), solid phase crystallization (SPC), sequential lateral solidification (SLS), metal induced lateral crystallization (MILC), and the like. The polysilicon layer is patterned to form a first semiconductor layer 131a. In this instance, the first source electrode 133a and the first drain electrode 135a are not formed on the first semiconductor layer 131a.

An inorganic insulating material, e.g., a silicon oxide or a silicon nitride, is deposited to form a first insulating layer 141. A conductive material, e.g., a metal, is deposited, e.g., sputtered, on the first insulating layer 141 to form a conductive layer, and it is patterned to form a first gate electrode 124a and a gate line 121.

Using the first gate electrode 124a as a mask, the first semiconductor layer 131a is ion-doped to form a first source electrode 133a and a first drain electrode 135a with low resistance. Most of the ion-doped impurity dopant is positioned in a crack and not in a lattice position on the first semiconductor layer 131a, so it needs to be activated when it is ion-doped. The activation may be performed by, e.g., performing a heat treatment in a furnace at a predetermined temperature for a predetermined time. However, when the substrate 110 is a plastic substrate and an activation temperature is lowered so as to prevent the substrate 110 from being damaged, the activation is insufficient to deteriorate reliability of the first transistor T1. According to an exemplary embodiment, when the activation temperature is lowered, annealing for reinforcing the activation may be performed in a subsequent process for forming a second semiconductor layer 131b of the second transistor T2. As an option, the activation of the first semiconductor layer 131a performed after the ion doping may be omitted, and the first semiconductor layer 131a may be activated in the subsequent process for forming the second semiconductor layer 131b.

Figure 6:
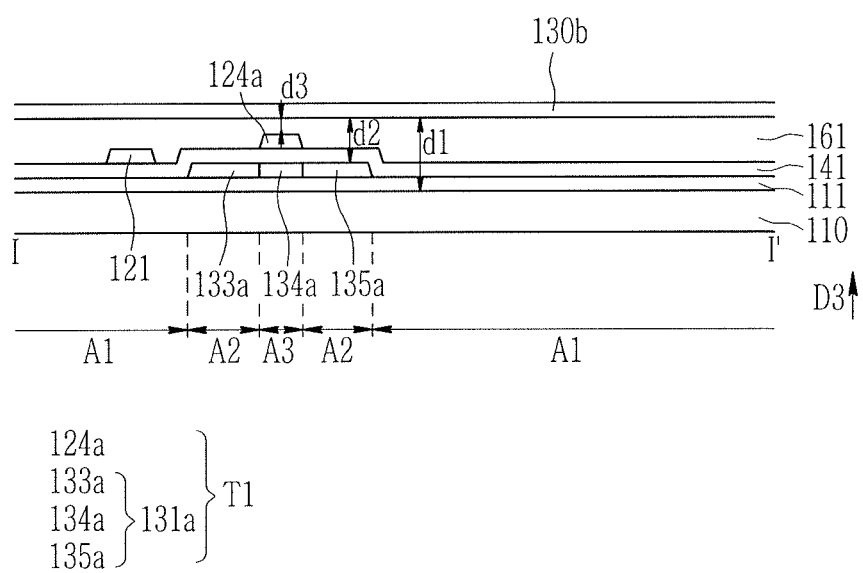

Referring to FIG. 6, a second insulating layer 161 is formed by depositing a silicon oxide or a silicon nitride on the first transistor T1 on which the first semiconductor layer 131a is not activated or is insufficiently activated. In this instance, the second insulating layer 161 may be formed so that the first distance d1 may be greater than the second distance d2 by about 420 to 520 angstroms, about 440 to 500 angstroms, or about 460 to 480 angstroms. Further, the second insulating layer 161 may be formed so that the third distance d3 may be less than the second distance d2 by about 420 to 520 angstroms, about 440 to 500 angstroms, or about 460 to 480 angstroms. The first distance d1 and the second distance d2 include the thickness of the buffer layer 111 and/or the first insulating layer 141, so the thickness of the buffer layer 111 and the first insulating layer 141 must be considered together with the same.

The meaning, the calculation grounds, and the detailed examples of the first distance d1, the second distance d2, and the third distance d3 have been described in detail with reference to FIG. 1 and FIG. 3, so they will not be described again. To increase uniformity of the first distance d1, the second distance d2, and the third distance d3 in the first region A1, the second region A2, and the third region A3, respectively, a surface of the second insulating layer 161 may be further planarized, e.g., by performing chemical mechanical planarization (CMP), after formation of the second insulating layer 161. The buffer layer 111 and the first insulating layer 141 may respectively be uniform in thickness throughout the first region A1, the second region A2, and the third region A3, and the second insulating layer 161 is the thickest in the first region A1 and is the thinnest in the third region A3.

A semiconductor material, e.g., amorphous silicon, may be deposited on the second insulating layer 161 to form an amorphous silicon layer, and the amorphous silicon layer may be crystallized to form a polysilicon layer 130h. The amorphous silicon layer may be formed to have a predetermined range of thickness in consideration of its transmittance and the characteristics of the second transistor T2. The excimer laser annealing method may be used to crystallize the amorphous silicon layer.

By setting the difference of thicknesses of the insulating layers provided between the substrate 110 and the amorphous silicon layer in the first region A1, the second region A2, and the third region A3, heat transmitted to the first source electrode 133a and the first drain electrode 135a of the first semiconductor layer 131a may be maximized when the amorphous silicon layer is crystallized, and heat transmitted to the substrate 110 and the first gate electrode 124a may be minimized. Therefore, when the amorphous silicon layer is crystallized, the first semiconductor layer 131a (particularly, the first source electrode 133a and the first drain electrode 135a) may be activated and annealed by using the heat applied to the first source electrode 133a and the first drain electrode 135a of the first semiconductor layer 131a, and the substrate 110 and the first gate electrode 124a may be prevented from being damaged. The annealing may be understood as additionally activating the first semiconductor layer 131a that is insufficiently activated. Further, at the time of ion doping, the damaged lattice of the first semiconductor layer 131a may be recrystallized through annealing.

Figure 7:
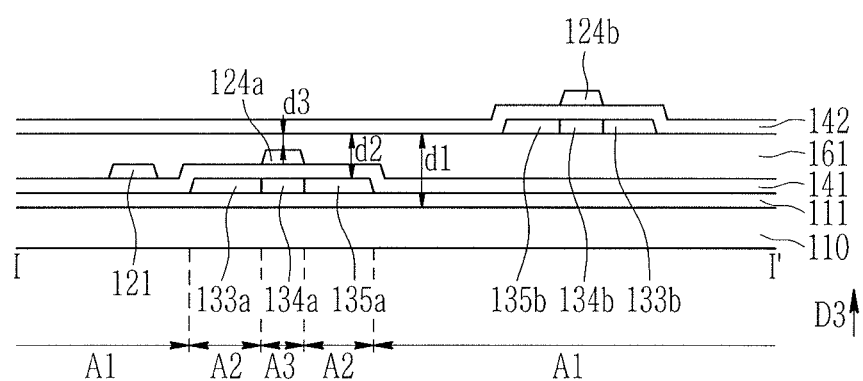

Referring to FIG. 7, a polysilicon layer 130b may be patterned to form a second semiconductor layer 131b, and an inorganic insulating material such as a silicon oxide or a silicon nitride is deposited to form a third insulating layer 142. A conductive material, e.g., a metal, may be deposited on the third insulating layer 142 to form a conductive layer, and is patterned, and thereby a second gate electrode 124b is formed. Using the second gate electrode 124b as a mask, the second semiconductor layer 131b is ion-doped to form the second source electrode 133b and the second drain electrode 135b with low resistance and activate the same. The second gate electrode 124b forms the second transistor T2 together with the second semiconductor layer 131b including the second source electrode 133b, the second channel 134b, and the second drain electrode 135b.

Figure 8:
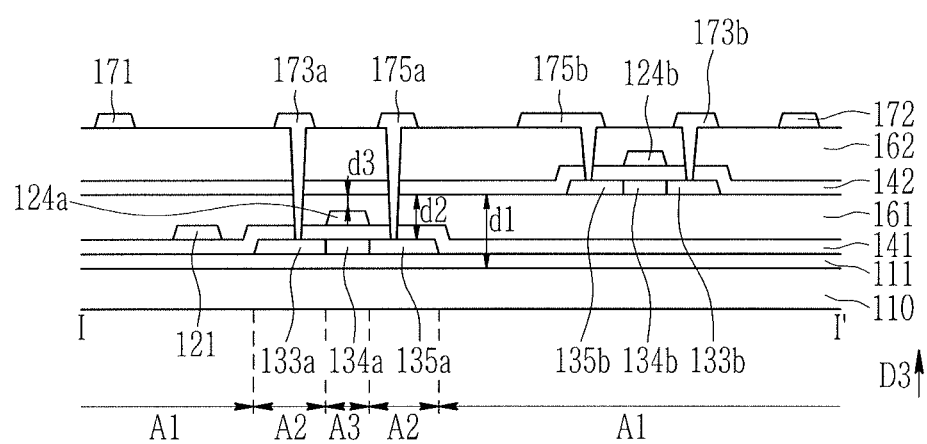

Referring to FIG. 8, an inorganic insulating material, e.g., silicon oxide or silicon nitride, may be deposited on the second transistor T2 to form a fourth insulating layer 162. Contact holes overlapping the first source electrode 133a and the first drain electrode 135a, respectively, may be formed in the first insulating layer 141, the second insulating layer 161, the third insulating layer 142, and the fourth insulating layer 162, and contact holes overlapping the second source electrode 133b and the second drain electrode 135b are respectively formed in the third insulating layer 142 and the fourth insulating layer 162. A conductive material such as a metal is deposited on the fourth insulating layer 162 to form a conductive layer, and it is patterned, and thereby a first source connector 173a and a first drain connector 175a connected to the first source electrode 133a and the first drain electrode 135a, a second source connector 173b and a second drain connector 175b connected to the second source electrode 133b and the second drain electrode 135b, a data line 171, and a driving voltage line 172 are formed.

Figure 9:
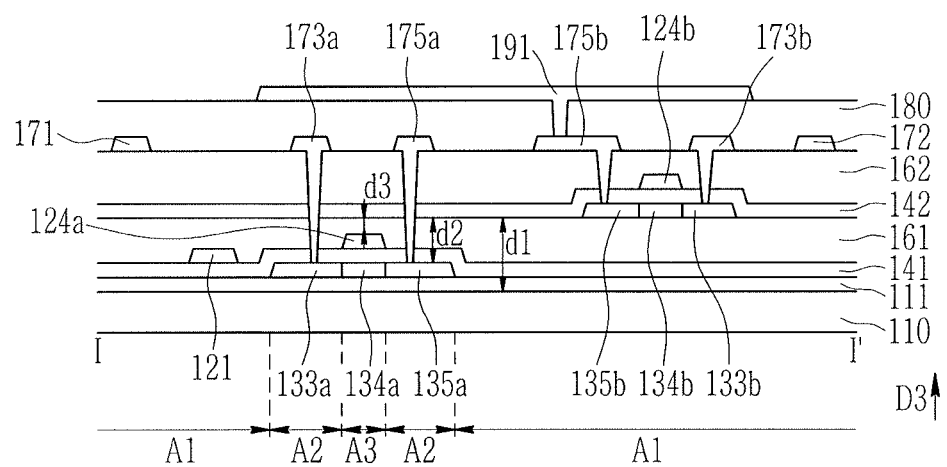

Referring to FIG. 9, an organic insulating material and/or an inorganic insulating material is deposited to form a planarized layer 180. A contact hole overlapping the second drain connector 175b is formed in the planarized layer 180, a conductive layer is formed on the planarized layer 180, and the same is patterned to thus form a pixel electrode 191 connected to the second drain connector 175b.

By forming a pixel defining layer 360, a light emitting member 370, a common electrode 270, and an encapsulation layer 390 on the pixel electrode 191, the display device shown in FIG. 1 may be manufactured.

By way of summation and review, a display device including transistors in a stacked structure, the characteristic of the lower transistor may be improved when the upper transistor is formed, and the processing cost may be reduced. In addition, according to the exemplary embodiments, heat may be selectively transmitted to the semiconductor layer of the lower transistor requiring activation or annealing without damaging other portions of the display device, such as a substrate, thereby improving reliability of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a substrate;
a buffer layer on the substrate;
a first semiconductor layer of a first transistor on the buffer layer;
a first insulating layer on the first semiconductor layer;
a first gate electrode of the first transistor on the first insulating layer;
a second insulating layer on the first gate electrode; and
a second semiconductor layer of a second transistor on the second insulating layer, wherein
a difference between a first distance between a lower side of the buffer layer and an upper side of the second insulating layer and a second distance between an upper side of the first semiconductor layer and an upper side of the second insulating layer is 420 to 520 angstroms, and
the first semiconductor layer and the second semiconductor layer respectively include polysilicon.

2. The display device as claimed in claim 1, wherein a difference between a third distance between an upper side of the first gate electrode and an upper side of the second insulating layer and the second distance is 420 to 520 angstroms.

3. The display device as claimed in claim 2, wherein the third distance corresponds to a thickness of the second insulating layer in a region overlapping the first gate electrode.

4. The display device as claimed in claim 1, wherein the first distance corresponds to a sum of thicknesses of the buffer layer, the first insulating layer, and the second insulating layer in a region not overlapping the first semiconductor layer.

5. The display device as claimed in claim 4, wherein the second distance corresponds to a sum of thicknesses of the first insulating layer and the second insulating layer in a region overlapping the first semiconductor layer and not overlapping the first gate electrode.

6. The display device as claimed in claim 1, wherein:
the second transistor includes a second gate electrode overlapping the second semiconductor layer, and
a thickness of the second semiconductor layer is equal to or less than 500 angstroms.

7. The display device as claimed in claim 6, wherein:
the first semiconductor layer includes a first channel overlapping the first gate electrode, and a first source electrode and a first drain electrode positioned at respective sides of the first channel, and
the second semiconductor layer includes a second channel overlapping the second gate electrode, and a second source electrode and a second drain electrode positioned at respective sides of the second channel.

8. The display device as claimed in claim 7, further comprising:
a third insulating layer between the second semiconductor layer and the second gate electrode; and
a fourth insulating layer on the second gate electrode,
wherein the first transistor includes a first source connector and a first drain connector connected to the first source electrode and the second drain electrode through contact holes passing through the first insulating layer, the second insulating layer, the third insulating layer, and the fourth insulating layer.

9. The display device as claimed in claim 1, further comprising:
a pixel electrode on the second transistor;
a light emitting member on the pixel electrode; and
a common electrode on the light emitting member.

10. A display device, comprising:
a substrate;
a buffer layer on the substrate;
a first semiconductor layer of a first transistor on the buffer layer;
a first insulating layer on the first semiconductor layer;
a first gate electrode of the first transistor on the first insulating layer;
a second insulating layer on the first gate electrode; and
a second semiconductor layer of a second transistor on the second insulating layer, wherein
the buffer layer, the first insulating layer, and the second insulating layer include a same material having a duty cycle between maximum transmittances with respect to a thickness of the same material, wherein a difference in thickness between a first sum of a thickness of the buffer layer, the first insulating layer, and the second insulating layer and a second sum of a thickness of the first insulating layer and the second insulating layer is about half a duty cycle or an odd integer multiple thereof, and the first semiconductor layer and the second semiconductor layer respectively include polysilicon.

\* \* \* \* \*